(12) United States Patent
Marten et al.

(10) Patent No.: US 6,590,949 B1
(45) Date of Patent: Jul. 8, 2003

(54) CIRCUIT AND METHOD FOR COMPENSATING A PHASE DETECTOR

(75) Inventors: Lance Alan Marten, Gilbert, AZ (US); William H. Gulliver, Gilbert, AZ (US); Bradley Michael Wemhaner, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/247,971

(22) Filed: Feb. 11, 1999

(51) Int. Cl.[7] ................................................ H03D 3/24
(52) U.S. Cl. ........................ 375/376; 375/374; 327/147; 327/148; 327/156; 327/157
(58) Field of Search ................................. 375/354, 357, 375/371, 373, 374, 294, 327; 331/1 A, 14, 2; 327/12, 141, 144, 147, 148, 153, 155

(56) References Cited

U.S. PATENT DOCUMENTS

| | | | | |
|---|---|---|---|---|
| 4,543,540 A | * | 9/1985 | Linder | 331/1 A |
| 5,592,113 A | * | 1/1997 | Quiet et al. | 327/158 |
| 5,834,950 A | * | 11/1998 | Co et al. | 327/12 |
| 6,150,889 A | * | 11/2000 | Gulliver et al. | 331/14 |
| 6,239,632 B1 | * | 5/2001 | Moyal et al. | 327/153 |
| 6,359,945 B1 | * | 3/2002 | Doblar | 375/357 |

\* cited by examiner

Primary Examiner—Shuwang Liu

(57) ABSTRACT

A Phase Locked Loop system (10) provides the signals UP and DOWN for a charge pump (14). The charge pump (14) supplies a biasing signal to a voltage controlled oscillator (18). The phase and frequency relationship between a feedback signal from the voltage controlled oscillator (18) and a clock signal are used by a compensating phase-frequency detector (12) to generate the signals UP and DOWN. The pulse width of the signal DOWN is limited when a transition of the clock signal is missed. An error detector (36) provides a signal BADCLK after detecting that multiple transitions of the clock signal have been missed. The signal BADCLK generates the signal UP having a pulse width that compensates for the last signal DOWN and keeps the biasing signal to the voltage controlled oscillator (18) relatively constant when the clock signal fails.

8 Claims, 2 Drawing Sheets

US 6,590,949 B1

CIRCUIT AND METHOD FOR COMPENSATING A PHASE DETECTOR

BACKGROUND OF THE INVENTION

The present invention relates in general, to Phase-Locked Loop (PLL) devices and, more particularly, to the stability of a Voltage-Controlled Oscillator (VCO) in a PLL.

Communications systems and computer systems have components that operate at different frequencies. Typically, these systems use Phase-Locked Loops (PLLs) for synchronization of their components. PLLs are widely used for clock generation in data communication systems, local area networks, data storage applications, disc drives, and microprocessors. A PLL generally includes a phase detector, a loop filter, a Voltage-Controlled Oscillator (VCO), and a loop divider. The phase detector receives a reference clock signal and a loop clock signal and provides a phase detect output signal that indicates the phase difference between the loop clock signal and the reference clock signal. The phase detector provides the phase detect output signal to an input of the loop filter, which in turn provides a filtered signal to the VCO. The filtered signal provides a voltage that adjusts the frequency and phase of the clock output signal generated by the VCO. The clock output signal is divided by the loop divider to provide the loop clock signal. When the loop clock signal is synchronized to the reference clock signal, these two signals have the desired phase-frequency relationship and the PLL is locked.

In some systems, it is desirable to switch the reference clock signal between one of two clock signals, i.e., a primary clock signal and a backup clock signal. A multiplexer is used to switch between the two clock signals. During normal operation, the primary clock signal serves as the reference clock signal. In the event of a failure of the primary clock signal, the select input of the multiplexer is toggled such that the backup clock signal becomes the reference clock signal. If the primary clock signal and backup clock signal are out of phase, then the PLL changes the frequency of its output signal to regain phase lock to the new reference clock signal, i.e., the backup clock signal.

The phase detector uses latches to detect the phase-frequency relationship between the reference clock signal and the loop clock signal. The latches switch states at the transition edges of the reference clock and the loop clock signals. The width of the pulses at the outputs of the latches indicate a phase relationship between the reference clock and the loop clock signal. When the primary clock signal fails, the phase detector does not receive a signal transition for the primary clock, causing the phase detector to generate an abnormally wide pulse. By the time the detection circuitry detects that the primary clock has failed and the multiplexer switches to the backup clock signal, the PLL changes frequency in response to the abnormally wide pulse. The PLL drifts from the desired phase-frequency relationship of the locked condition.

Accordingly, it would be advantageous to have a PLL device and a method for reducing the drift in frequency and phase when the reference clock signal fails. It would be of further advantage to have a PLL that minimizes the amount of time it takes to regain phase lock when the PLL device receives a backup reference clock signal.

DETAILED DESCRIPTION OF THE DRAWINGS

Figure 1:
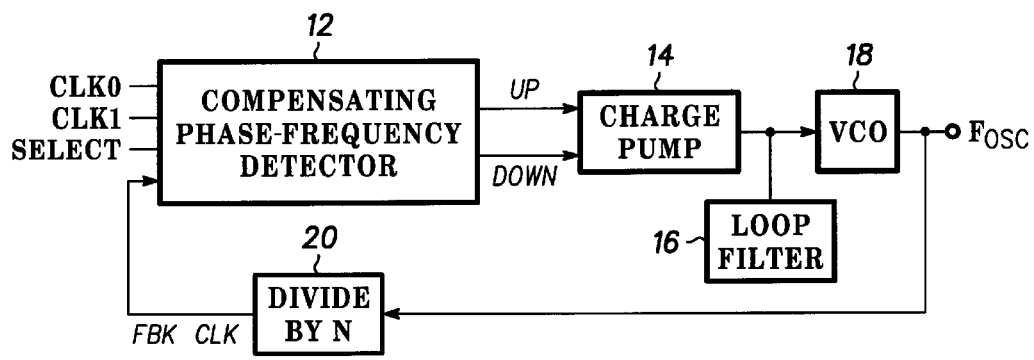
FIG. 1 is a block diagram of a phase-locked loop system.

FIG. 1 is a block diagram of a Phase-Locked Loop (PLL) system 10, also referred to as a clock generator block for an integrated circuit. PLL system 10 includes a compensating Phase-Frequency Detector (PFD) 12. Compensating PFD 12 receives a primary clock signal CLK0 and a secondary clock signal CLK1. The secondary clock signal is also referred to as a backup clock signal. Typically, the backup clock signal has the same frequency and phase as the primary clock signal, although this is not a limitation of the present invention. Compensating PFD 12 also receives a signal SELECT and a feedback signal FBK CLK. PFD 12 has two output terminals that are connected to corresponding input terminals of a charge pump 14. Charge pump 14 is also referred to as an integrator circuit. An output terminal of charge pump 14 is connected to a terminal of a loop filter 16. The terminal of loop filter 16 is connected to an input terminal of a Voltage-Controlled Oscillator (VCO) 18. An output terminal of VCO 18 is connected to an input terminal of a divide-by-N counter 20. A signal $F_{OSC}$ is supplied at the output of VCO 18. The output terminal of divide-by-N counter 20 supplies the feedback signal and is connected to the input terminal of PFD 12. PLL system 10 adjusts a bias voltage that is supplied at the input terminal of VCO 18 and synchronizes the selected clock signal with the feedback signal.

Figure 2:
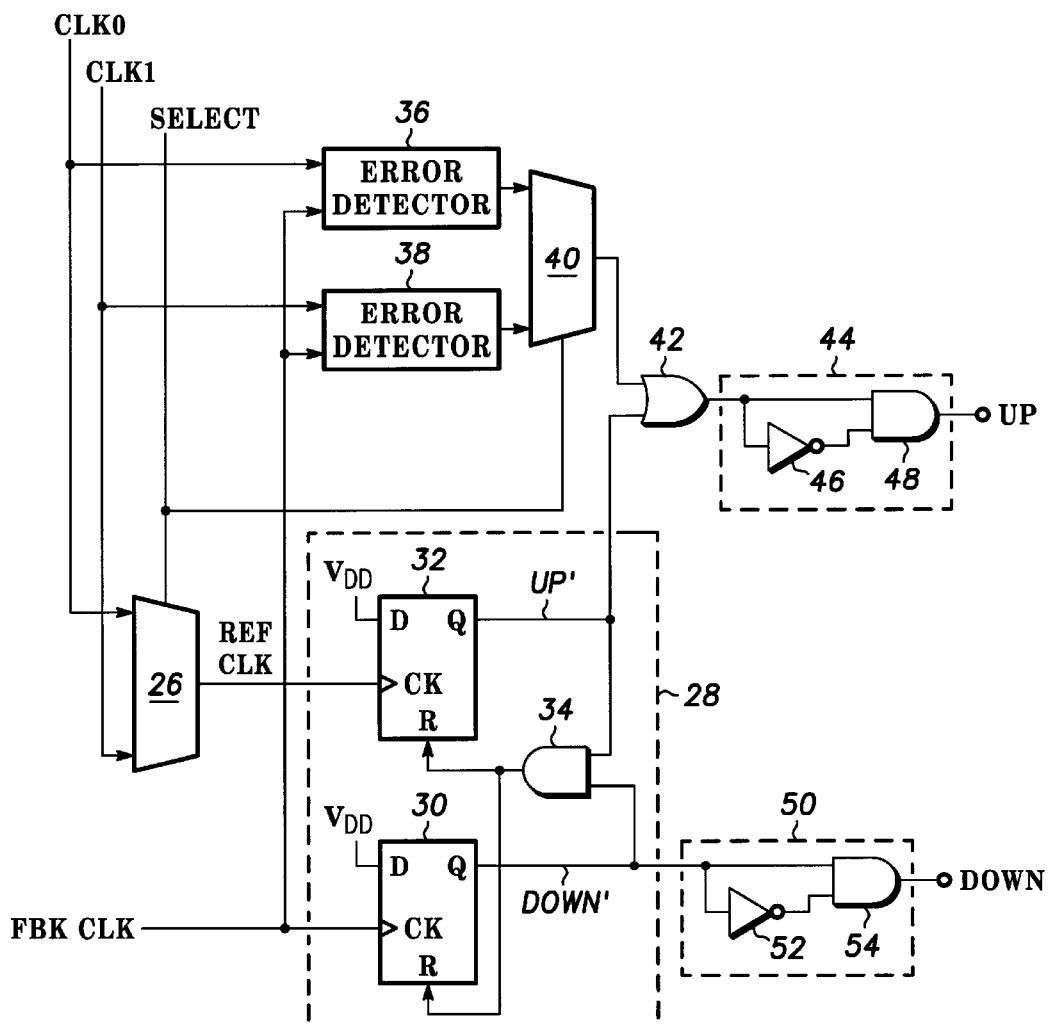
FIG. 2 is a schematic diagram of the compensating PFD of FIG. 1.

FIG. 2 is a schematic diagram of compensating PFD 12 of FIG. 1. It should be noted that the same reference numbers are used in the figures to denote the same elements. Compensating PFD 12 includes a multiplexer (MUX) 26 having first and second inputs for receiving the primary clock signal and the backup clock signal. The signal SELECT determines whether the primary clock signal or the backup clock signal is transferred to the output of MUX 26 as the reference clock signal (REF CLK).

A Lead/Lag circuit 28 has first and second input terminals for receiving the signals REF CLK and FBK CLK, respectively. Lead/Lag circuit 28 is a phase detector that includes two D-type latches 30 and 32, and an AND-gate 34 for determining the phase difference between the signals REF CLK and FBK CLK. Latches 30 and 32 each have a data input terminal labeled D, a true clock input terminal labeled CLK, a reset input terminal labeled R, and a true output terminal labeled Q. Terminal D of latches 30 and 32 are coupled for receiving a source of operating potential or power supply voltage such as, for example, a voltage labeled VDD. Input terminal CLK of latch 32 is connected to the first input terminal of Lead/Lag circuit 28. Input terminal CLK of latch 30 is connected to the second input terminal of Lead/Lag circuit 28. The output terminal Q of latch 32 is commonly connected to the first output terminal of Lead/Lag circuit 28 and to the first input terminal of AND-gate 34. The output terminal Q of latch 30 is commonly connected to the second output terminal of Lead/Lag circuit 28 and to the second input terminal of AND-gate 34. The signals UP' and DOWN' are supplied from the respective first and second output terminals of Lead/Lag circuit 28. The output of AND-gate 34 is commonly connected to the input terminals R of latches 30 and 32.

An error detector 36 has first and second input terminals that receive the signals CLK0 and FBK CLK. An error detector 38 has first and second input terminals that receive the signals CLK1 and FBK CLK. The output terminals of error detector 36 and error detector 38 are connected to respective first and second input terminals of a MUX 40. The signal SELECT determines whether the signal from error detector 36 or the signal from error detector 38 is transferred to the output of MUX 40.

The first output terminal of Lead/Lag circuit 28 is coupled to a first output terminal of compensating PFD 12 for supplying the signal UP. More particularly, the output of latch 32 is connected to a first input of a two input OR-gate 42. The second input of OR-gate 42 is connected to an output of MUX 40. The output of OR-gate 42 is connected to an input of a pulse width limiter 44. The output of pulse width limiter 44 supplies the signal UP and is connected to the output of compensating PFD 12. Further, the second output terminal of Lead/Lag circuit 28 is coupled, via a pulse width limiter 50, to a second output terminal of compensating PFD 12 for supplying the signal DOWN.

Pulse width limiter 44 includes an inverter 46 and an AND-gate 48. The input of inverter 46 is commonly connected to the input of pulse width limiter 44 and to an input of AND-gate 48. The output of inverter 46 is connected to the other input of AND-gate 48. The output of AND-gate 48 is the output of pulse width limiter 44, which is connected to the first output terminal of compensating PFD 12. Similarly, pulse width limiter 50 includes an inverter 52 and an AND-gate 54. The input of inverter 52 is commonly connected to the input of pulse width limiter 50 and to an input of AND-gate 54. The output of inverter 52 is connected to the other input of AND-gate 54. The output of AND-gate 54 is the output of pulse width limiter 50, which is connected to the second output terminal of compensating PFD 12. Although pulse width limiters 44 and 50 are shown with only one inverter, additional inverter pairs could be added in series with either inverter 46 or 52. The inverter pairs increase the signal conduction path and add a time delay that causes the pulse width limiters to generate wider pulses. Inverters 46 and 52 are also referred to as a delay circuit. It should be understood that AND-gates 48 and 54 illustrate the desired AND function and are implemented as a NAND-gate connected to an inverter (not shown in the figures).

Figure 3:
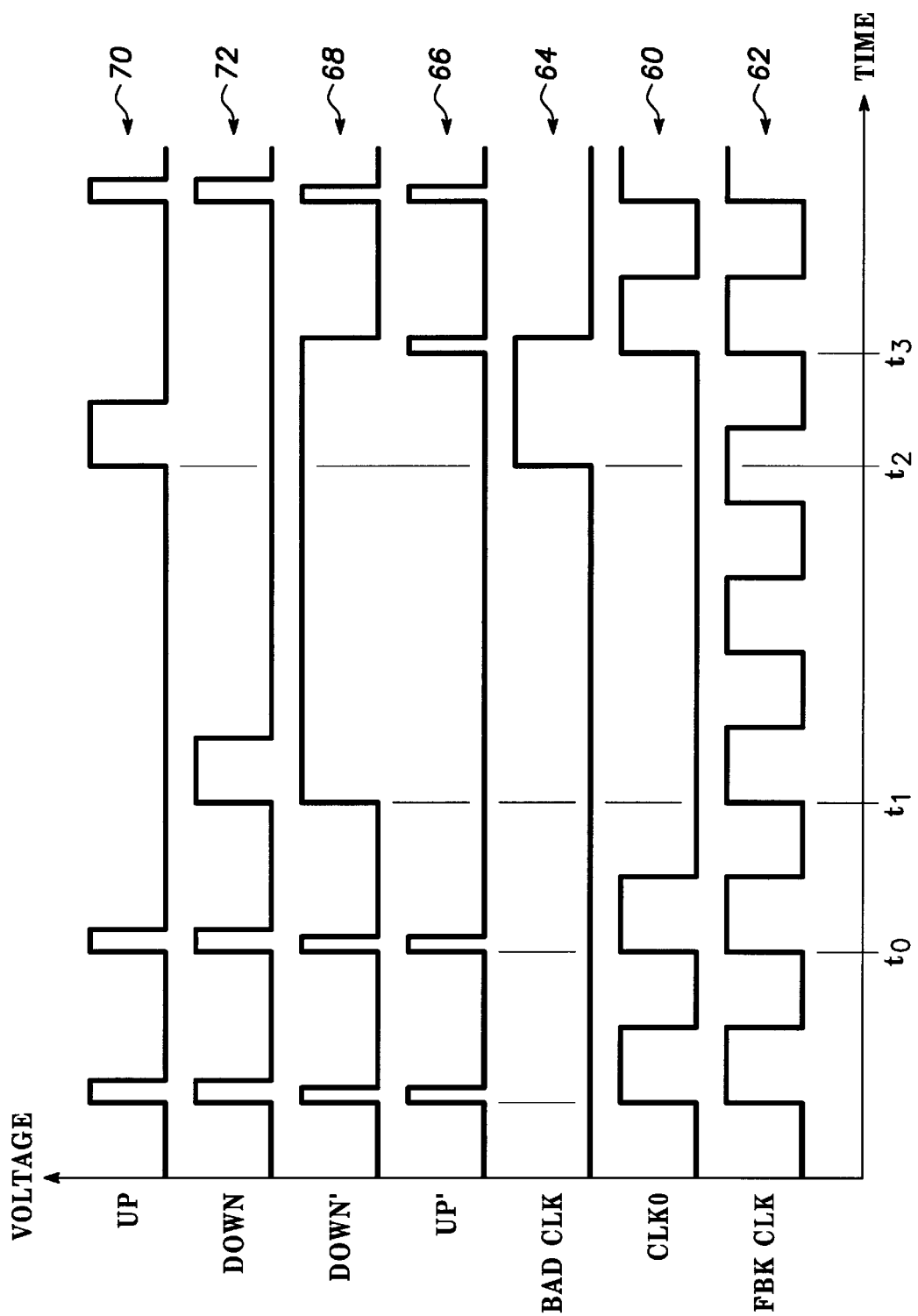
FIG. 3 illustrates timing signals that show the relationship of input and output signals for the compensating PFD as illustrated in FIG. 2.

FIG. 3 illustrates timing signals that show the relationship of the input and output signals of compensating PFD 12 as illustrated in FIG. 2. The horizontal axis of FIG. 3 represents time and the vertical axis represents voltage. Waveform 60 represents the timing for the primary clock signal CLK0. Waveform 62 represents the timing for the feedback clock signal FBK CLK. Waveform 64 represents the timing for the signal BADCLK at the output of MUX 40. Waveform 66 represents the timing for the signal UP' that is generated by latch 32. Waveform 68 represents the timing for the signal DOWN' that is generated by latch 30. Waveform 70 represents the timing for the signal UP that is supplied at the first output terminal of compensating PFD 12. Waveform 72 represents the timing for the signal DOWN that is supplied at the second output terminal of compensating PFD 12.

In operation, referring to FIGS. 2 and 3, PFD 12 generates the signals UP and DOWN in response to either the primary or backup clock signals, as selected by MUX 26, and the feedback clock. PFD 12 detects the phase difference between selected edges of the signal REF CLK and the signal FBK CLK. By way of example, if the signal REF CLK leads the signal FBK CLK, then the signal UP' is at a logic high and signal DOWN' is at a logic low until the signal FBK CLK transitions. A first signal is said to be leading a second signal when the first signal transitions from a logic low level to a logic high level before the second signal transitions from a logic low level to a logic high level. Thus, the signal UP' transitions from a low state to a high state, i.e., a logic one level, and maintains that logic state during the time that the signal REF CLK is leading the signal FBK CLK. The pulse width of the signal UP' varies based on the time that the signal REF CLK is leading the signal FBK CLK, i.e., the phase difference between the two signals.

On the other hand, the first signal is said to be lagging the second signal when the first signal transitions from a logic low level to a logic high level after the second signal transitions from a logic low level to a logic high level. By way of example, the signal DOWN' transitions from a low state to a high state, i.e., a logic one level, and maintains that logic state during the time that the signal REF CLK is lagging the signal FBK CLK. When the signal REF CLK lags the signal FBK CLK, the signal UP' is at a logic low and the signal DOWN' is at a logic high until the signal REF CLK transitions. The pulse width of the signal DOWN' varies based on the time that the signal REF CLK is lagging the signal FBK CLK, i.e., the phase difference between the two signals.

FIG. 3 shows the condition at time $t_0$ when MUX 26 selects the signal CLK0 for transfer as REF CLK to the first input of Lead/Lag circuit 28. The signal FBK CLK is supplied at the second input of Lead/Lag circuit 28. Waveforms 60 and 62 show that PLL system 10 has synchronized the phase and frequency of the signals CLK0 and FBK CLK. The signals UP' and DOWN' are generated by respective latches 32 and 30 at the low to high signal transitions of the signals REF CLK and FBK CLK at time $t_0$. It should be noted however, that the rising edges and the width of the pulses for the signals UP' and DOWN' are substantially the same, a condition that substantiates that the signals REF CLK and FBK CLK are synchronized. The width of the pulses for the UP' and DOWN' signals is based on the signal propagation time delay of AND-gate 34 in resetting latches 30 and 32.

Charge pump 14 receives the signals UP and DOWN and generates charge that is placed a node of loop filter 16. The signals UP and DOWN alter the charge on the node of loop filter 16. Loop filter 16 provides a Direct Current (DC) signal by filtering out the Alternating Current (AC) component of the charge pump signal, leaving only the DC component of the charge pump signal. The magnitude of the DC signal is adjusted in accordance with the phase difference between signal REF CLK and the signal FBK CLK. If signal REF CLK leads the signal FBK CLK, then the magnitude of the DC signal is increased. On the other hand, if signal the REF CLK lags the signal FBK CLK, then the magnitude of the DC signal is decreased. VCO 18 receives the DC signal and produces an output signal $F_{OSC}$ having a particular phase and frequency. The signal $F_{OSC}$ is reduced in frequency by divide-by-N counter 20 in generating the feedback signal FBK CLK to compensating PFD 12.

When the signals UP and DOWN have rising edges that transition together and pulse widths that are substantially the same, then PLL system 10 is stable and the phase and frequency of the signals REF CLK and FBK CLK match. Further, when the signals REF CLK and FBK CLK have substantially the same phase and frequency, the DC signal at the node of loop filter 16 is stabilized. At time $t_0$, the UP' and DOWN' pulses match and do not substantially alter the charge on the node of loop filter 16 and in this condition, PLL system 10 is referred to as "locked".

At time $t_1$, the primary clock, i.e., signal CLK0, has failed as indicated by the missing low to high edge transition that would occur at time $t_1$ if the primary clock had not failed. Thus, the signal REF CLK is missing the edge that causes latch 32 to generate the signal UP', as shown by the missing pulse in waveform 66 at time $t_1$. By not generating the UP' signal, latches 30 and 32 are not reset by AND-gate 34. The signal DOWN' stays at a high level after latch 30 receives the transition of the signal FBK CLK at time $t_1$.

Upon receiving the signal DOWN', pulse width limiter 50 generates the signal DOWN having a pulse width that is set in part by the signal propagation time through inverter 52. The propagation time of inverter 52 depends on the geometries of the N-channel and P-channel devices that comprise inverter 52. In addition, the width of the signal DOWN depends on the geometries of the transistors that comprise AND-gate 54. Referring to FIG. 3, although the signal DOWN' transitions from a low level to a high level and remains at the high level, pulse width limiter 50 is designed to limit the pulse width of the input signal to a predetermined or set value. After limiting the pulse width to the predetermined value, PLL system 10 continues to operate, maintaining the output signal $F_{OSC}$ at a relatively constant frequency.

As previously mentioned, the pulse width of the signal DOWN can be increased if desired, by the addition of inverter pairs that are placed in series with inverter 52. Thus, even with the failure of the primary clock, pulse width limiter 50 provides the signal DOWN having a pulse width-value that causes charge pump 14 to decrease the DC signal into VCO 18 by a fixed amount. It should be noted that the time delay path for the pulse width limiters can be configured with the inverter pairs to increase the pulse width or designed to decrease the pulse width.

Referring to FIG. 2, error detector 36 receives the signals CLK0 and FBK CLK and determines whether the primary clock, e.g., CLK0, has failed. Similarly, error detector 38 receives the signals CLK1 and FBK CLK and determines whether the secondary clock, e.g., CLK1, has failed. MUX 40 transfers either the output signal of error detector 36 or the output signal of error detector 38 to the output of MUX 40 as the signal BADCLK. It should be pointed out that the signal FBK CLK continues to run even though the primary clock or the secondary clock fails. The signal FBK CLK is used within error detector 36 as a clock signal at the clock input of a counter or a shift register (not shown). The signal CLK0 is the input to the reset terminal of the counter or shift register. The error detectors receive both a clock signal for counting and a reset signal that prevents the counter or shift register from shifting. When the primary clock, secondary clock, and FBK CLK signals are active and transitioning, the error detectors are clocked and reset within one or two clock periods and an upper count is not reached. However, when a primary clock fails, error detector 36 is not reset and an upper count is reached. Likewise, a secondary clock that fails does not reset error detector 38 and an upper count is reached. The upper count causes a low to high signal transition that is transferred through MUX 40 as the signal BADCLK (see waveform 64, FIG. 3).

Briefly referring to FIG. 3, at time to the signal CLK0 has transition edges that about match the transition edges of the signal FBK CLK. The counter or shift register within error detector 36 is continually being reset and an upper count of the counter or stage of the shift register is not reached. The signal BADCLK has a low level at time to. However, when the primary clock fails, the signal CLK0 does not reset the counter or shift register and the upper count or stage is reached. At time $t_1$ the primary clock has failed and error detector 36 generates the signal BADCLK at time $t_2$ to indicate that the primary clock signal has failed. By way of example, error detector 36 determines that the primary clock has failed within about two or three clock periods of the signal FBK CLK.

With the failure of the primary clock, the signal UP' at time $t_1$ missed a pulse which caused an imbalance in the signals UP and DOWN. The signal DOWN at time $t_1$ does not have a corresponding signal UP. Therefore, the signal DOWN at time $t_1$ causes the DC signal supplied to VCO 18 to be lower. VCO 18 reduces the frequency of the signal $F_{OSC}$ in accordance with the lower DC signal that is used to bias VCO 18. When error detector 36 generates the signal BADCLK as an input to OR-gate 42, the signal BADCLK causes a signal UP to be generated at time $t_2$.

Pulse width limiter 44 receives the low to high transition of the signal BADCLK (see waveform 64) and generates a pulse for the signal UP. The pulse width of the signal UP (see waveform 70) at time $t_2$ substantially matches the pulse width of the signal DOWN (see waveform 72) at time $t_1$. Therefore, the signal UP at time $t_2$ causes the DC signal supplied to VCO 18 to be increased by about the same as the DC signal was decreased at time $t_1$. By design, pulse width limiters 44 and 50 each provide the same signal path delay times. VCO 18 increases the frequency of the signal $F_{OSC}$ in accordance with the higher DC signal that is used to bias VCO 18. Thus, by detecting that the primary clock has failed, the signal BADCLK is used to generate a signal DOWN having a pulse width that corresponds to the pulse width of a previously generated signal UP, i.e., both pulse widths have a predetermined value by design. The change in the charge on the node of loop filter 16 from the signal DOWN at time $t_1$ and the signal UP at time $t_2$ is about zero. PLL system 10 supplies a signal $F_{OSC}$ having about the same phase and frequency as the signal when PLL system 10 is in the desired locked condition.

Referring to FIG. 3, at time $t_3$, waveform 60 shows that the primary clock has returned and the signal CLK0 has a phase and frequency that is close to that of the signal CLK0 at time $t_0$. Alternatively, briefly referring to FIG. 2, the signal SELECT could cause the secondary clock to be selected. The signal CLK1 would be transferred through MUX 26 and become the signal REF CLK. In either case, the signal REF CLK transitions to cause Lead/Lag circuit 28 to generate the signals UP' and DOWN'. It should be pointed out that VCO 18 may generate the signal $F_{OSC}$ that has a phase and frequency that is slightly different than the desired phase and frequency. The signals for UP' or DOWN' may, therefore, have different pulse widths at time $t_3$ when compared to the pulse widths of the signals at time $t_1$.

By now it should be appreciated that a Phase-Locked Loop (PLL) device and a method for minimizing the frequency and phase change of the PLL device when a primary clock fails have been provided. Unlike prior art PLL devices, the PLL device of the present invention retains a near phase lock condition when the primary clock fails and the PLL system switches to a secondary or backup clock. It should be pointed out that the pulse width limiters can be disabled. Disabling the pulse width limiters allows the PLL to function normally and become phase and frequency locked as quickly as possible during startup.

What is claimed is:
1. A circuit for comparing a phase between first and second input signals, comprising:
   a phase detector having a first and second inputs coupled for receiving the first and second input signals, and a first output for providing a first output signal if an edge of the first input signal leads an edge of the second input signal, wherein the phase detector further includes a second output for providing a second output signal if the edge of the second input signal leads the edge of the first input signal;

a first pulse limiter circuit coupled to the first output of the phase detector for setting a pulse width of the first output signal to a first predetermined value;

a second pulse limiter circuit coupled to the second output of the phase detector for setting a pulse width of the second output signal to a second predetermined value; and an edge detector having first and second inputs coupled for receiving the first and second input signals respectively, and an output for providing a detect signal after receiving an edge of the first input signal without receiving an edge of the second input signal, wherein the detect signal provides the second output signal if the edge of the first input signal occurs without the edge of the second input signal.

2. The circuit of claim 1, further including a logic gate having a first input coupled to the second output of the phase detector, a second input coupled for receiving the detect signal, and an output providing the second output signal of the circuit.

3. A circuit for providing first and second output signals representative of a phase difference between first and second input signals, comprising:

an edge detector having first and second inputs coupled for receiving the first and second input signals respectively, and an output for providing a detect signal after receiving an edge of the first input signal without receiving an edge of the second input signal; and a phase detector having first and second inputs coupled for receiving the first and second input signals, and first and second outputs for providing the first and second output signals respectively, wherein the detect signal provides the second output signal if the edge of the first input signal occurs without the edge of the second input signal.

4. The circuit of claim 3, further including a pulse limiter circuit coupled to the first output of the phase detector for setting a pulse width of the first output signal to a first predetermined value.

5. The circuit of claim 4, wherein the pulse limiter circuit includes:

a delay circuit having an input coupled to the first output of the phase detector; and a logic gate having a first input coupled to the first output of the phase detector, a second input coupled to an output of the delay circuit, and an output for providing a first limited output signal.

6. The circuit of claim 3, wherein the phase detector includes:

a first latch having a first input coupled for receiving the first input signal, a second input coupled to a power conductor, and an output coupled to the first output of the phase detector;

a second latch having a first input coupled for receiving the second input signal, a second input coupled to the power conductor, and an output coupled to the second output of the phase detector; and a logic gate having a first input coupled to the output of the first latch, a second input coupled to the output of the second latch, and an output coupled to a third input of the first and second latches.

7. The circuit of claim 6, further including a logic gate having a first input coupled to the second output of the phase detector, a second input coupled for receiving the detect signal, and an output providing the second output signal of the circuit.

8. The circuit of claim 7, further including a first pulse limiter circuit coupled to the output of the logic gate for setting a pulse width of the second output signal to a first predetermined value.

* * * * *